(12) United States Patent
Hool et al.

(10) Patent No.: US 7,501,709 B1
(45) Date of Patent: Mar. 10, 2009

(54) BGA PACKAGE WITH WIRING SCHEMES HAVING REDUCED CURRENT LOOP PATHS TO IMPROVE CROSS TALK CONTROL AND CHARACTERISTIC IMPEDANCE

(75) Inventors: Vincent Hool, Pleasanton, CA (US); Hong Shi, Santa Rosa, CA (US); Yuanlin Xie, Fremont, CA (US); Tarun Verma, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/510,306

(22) Filed: Aug. 25, 2006

(51) Int. Cl.
*H01L 23/48* (2006.01)
*H01L 21/44* (2006.01)

(52) U.S. Cl. .................. 257/784; 257/691; 257/698; 257/773; 257/786; 257/E23.024; 438/617

(58) Field of Classification Search ............ 257/691, 257/786, 784, 698, E23.024; 438/617
See application file for complete search history.

(56) References Cited

U.S. PATENT DOCUMENTS

| | | | | |
|---|---|---|---|---|
| 5,144,747 A | * | 9/1992 | Eichelberger | 29/834 |
| 5,686,699 A | * | 11/1997 | Chu et al. | 174/542 |
| 6,137,168 A | * | 10/2000 | Kirkman | 257/691 |
| 6,433,441 B1 | * | 8/2002 | Niwa et al. | 257/784 |
| 6,608,379 B2 | * | 8/2003 | Yeo et al. | 257/706 |
| 6,812,580 B1 | * | 11/2004 | Wenzel et al. | 257/784 |
| 6,897,555 B1 | * | 5/2005 | Lim et al. | 257/692 |
| 6,921,981 B2 | * | 7/2005 | Tien | 257/786 |
| 2001/0011768 A1 | * | 8/2001 | Kohara et al. | 257/692 |
| 2007/0170601 A1 | * | 7/2007 | Miyaki et al. | 257/784 |

OTHER PUBLICATIONS

Johnson, "BGA Crosstalk, Xilinx® Virtex™-4 FPGA and Altera® Stratix® II FPGA", Xilinx Corporation, Mar. 1, 2005.

* cited by examiner

*Primary Examiner*—Nitin Parekh
(74) *Attorney, Agent, or Firm*—Weaver Austin Villeneuve & Sampson LLP

(57) ABSTRACT

A Ball Grid Array (BGA) integrated circuit package having (i) an additional dedicated ground ring on the package substrate which provides a reduced area return current loop path to reduce wire bond inductance; and/or (ii) ground wires positioned between adjacent input/output wires on the substrate which provide additional transient current paths among the input/output wires for improved characteristic impedance and cross talk control.

21 Claims, 3 Drawing Sheets

BGA PACKAGE WITH WIRING SCHEMES HAVING REDUCED CURRENT LOOP PATHS TO IMPROVE CROSS TALK CONTROL AND CHARACTERISTIC IMPEDANCE

BACKGROUND

1. Field of the Invention

The present invention generally relates to integrated circuits, and more particularly, to Ball Grid Array (BGA) integrated circuit packages having various ground wiring schemes which provide one or more of the following: a reduced return current loop reduced wire bond inductance and/or improved characteristic impedance and cross talk control between bond wires.

2. Description of Related Art

One type of common package for semiconductor integrated circuits is a Ball Grid Array, often referred to as a BGA package. Typically, a BGA includes a die mounted onto a substrate using some type of die attach material. The substrate is usually made of an epoxy material with metal contacts formed on the top surface. Wire bonds are provided between contact pads on the die and the metal contacts on the substrate. Metal traces along the surface and through the thickness of the substrate electrically couple the metal contacts on the top surface of the substrate to metal balls formed on the bottom surface of the substrate. The metal balls are typically arranged in a grid or array, hence the name Ball Grid Array or BGA package, and are used to mount the package onto a printed circuit board or the like. The balls are aligned and soldered to matching contacts on the printed circuit board. Electrical input and output (I/O), power and ground signals can thus be provided to the chip through the balls, traces, and bond wires to the die encapsulated in the package.

Depending on the complexity of the die, two, three or more rows of bond pads, arranged in a staggered pattern, can be provided around the outer periphery of the die. A ground and power ring are provided on the substrate, around the perimeter of the die, when mounted on the substrate. Wire bonds are formed between individual contacts in the ground and power rings of the substrate and like bond pads on the die to provide power and ground signals to the circuitry on the die. Generally speaking, the ground and power rings are positioned as close to the die as possible to prevent or minimize power loss due to the inductance and resistance of the wire bonds. As a consequence, the I/O contacts are almost always placed outside the power and grounds rings on the substrate surface.

The I/O contacts positioned beyond the ground and power rings on the surface of the substrate creates several problems. With the above-described arrangement, the input/output wires are a distance away from the return ground path wires. As a result, a significant amount of cross talk between the input/output wires may occur. Secondly, the return current loop is relatively large with the I/O contacts placed outside or beyond the power and ground rings on the substrate surface. For a detailed discussion on both cross talk and the return current loop issues, see for example, "BGA Crosstalk", delivered on the tech on-line forum by Dr. Howard Johnson, Mar. 1, 2005, incorporated by reference herein for all purposes.

A Ball Grid Array (BGA) integrated circuit package having (i) an additional dedicated ground ring on the package substrate which provides a reduced return current loop path to reduce wire bond inductance; and/or (ii) ground wires positioned between adjacent input/output wires on the substrate which provide additional transient current paths among the input/output wires for improved characteristic impedance and cross talk control is therefore needed.

SUMMARY OF THE INVENTION

A Ball Grid Array (BGA) integrated circuit package having (i) an additional dedicated ground ring or ring of ground contacts on the package substrate which provides a reduced return current loop path to reduce wire bond inductance; and/or (ii) ground wires positioned between adjacent input/output wires on the substrate which provide additional transient current paths among the input/output wires for improved characteristic impedance and cross talk control. In one embodiment, ground wire bonds are provided between pairs of ground contacts on the substrate of the BGA package. The ground wires run adjacent to and for a portion of the length of the input/output bond wires provided between the die and the substrate of the package. The ground wires provide a reduced ground loop path, but also improved cross talk control and characteristic impedance. Another embodiment covers a wiring scheme for a BGA package wherein wire bonds are formed between an inner most ground (GND) ring of contacts, one or more middle rings of input/output (I/O) contacts, and an outer ring of power/ground (P/G) contacts on the die and a first, inner most ring of power/ground (P/G) contacts, one or more rings of input/output (I/O) contacts, and an outer ring of ground (GND) contacts on the substrate respectively. With this arrangement, each input/output (I/O) bond wire has a nearby ground wire as a return current loop. Thus, the length of the return current loop is significantly reduced

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1A:
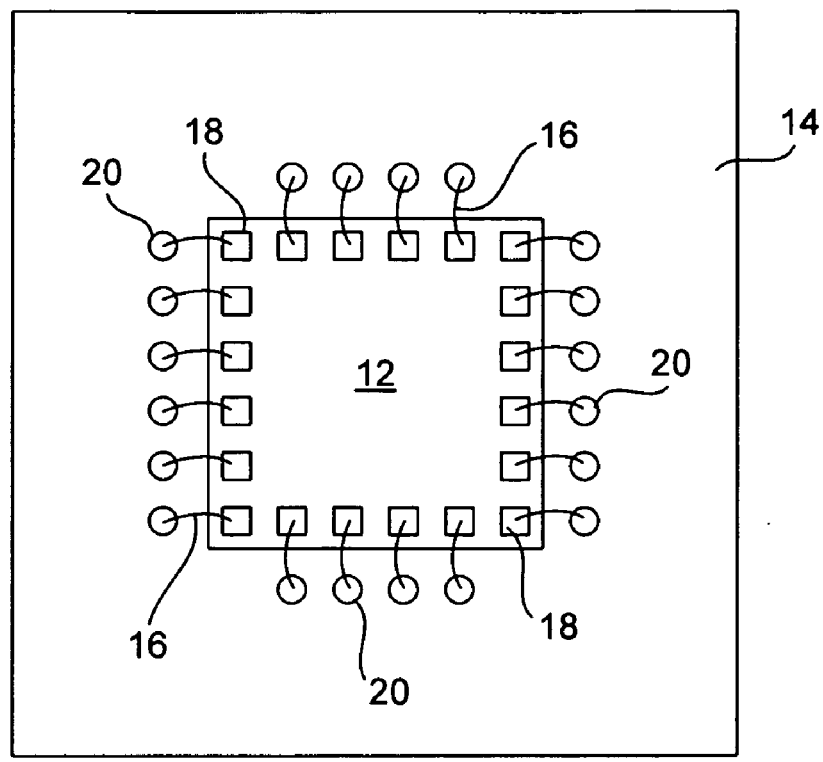
FIGS. 1A and 1B are top down and cross section views of a BGA package.
Figure 1B:
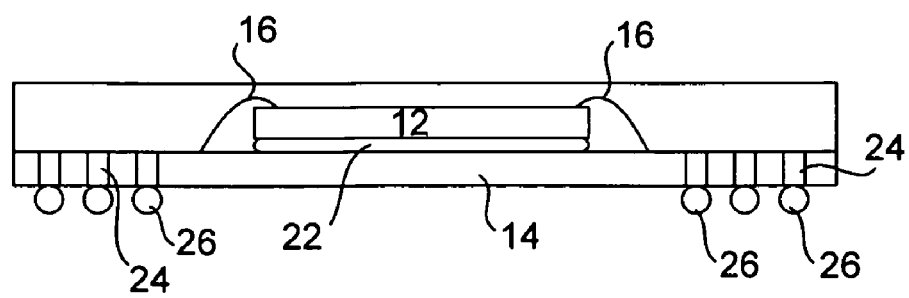

Referring to FIGS. 1A and 1B, top down and cross section views of a BGA package is shown.

As illustrated in FIG. 1A, the package 10 includes a die 12 mounted onto a substrate 14. A plurality of wire bonds 16 electrically couple die pads 18 on the surface of the die 12 to electrical contacts 20 on the substrate 14. Traces (not visible)

through the substrate 14 provide electrical connections between the contacts 20 and solder balls located on the underside of the substrate 14.

In FIG. 1B, a cross section of the package 10 is shown. The die 12 is mounted onto the substrate 14 using a die attach material 22. The wire bonds 16 are formed between the die pads 18 on the active surface of the die 12 and the contacts 20 on the substrate 14. Traces 24 through the substrate 14 electrically connect the contacts 20 to the solder balls 24 on the bottom surface of the substrate. The solder balls 26 are typically mounted onto like contacts on a printed circuit board. Thus, input and output signals, along with power and ground signals, are provided to the die 12 through the solder balls 26, traces 24 and wire bonds 16.

Conventional BGA packages typically include two rings of contacts 18 on the surface of the die 12. The outer ring along the periphery of the die 12 are power/ground (P/G) contacts. The inner ring are input/output (I/O) signal contacts. The substrate 14 also has a number of rings of contacts 20. The inner most ring of contacts are power and ground (P/G). The outer rings are input/output ("I/0") contacts. In various known BGA packages, one, two and three rings of input/output contacts have been used. As previously noted, the above-described arrangement may cause issues related to cross talk between the input/output wires and/or a large return current loop. The packages of the present invention, as described in more detail below, describe several packages to substantially eliminate or reduce these issues.

Figure 2A:
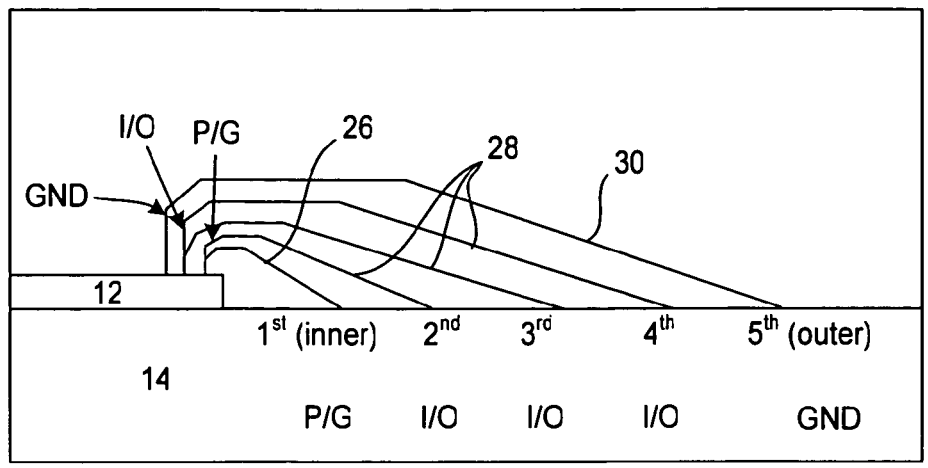
FIGS. 2A-2C are diagrams of a BGA package according to one embodiment of the present invention.
Figure 2B:
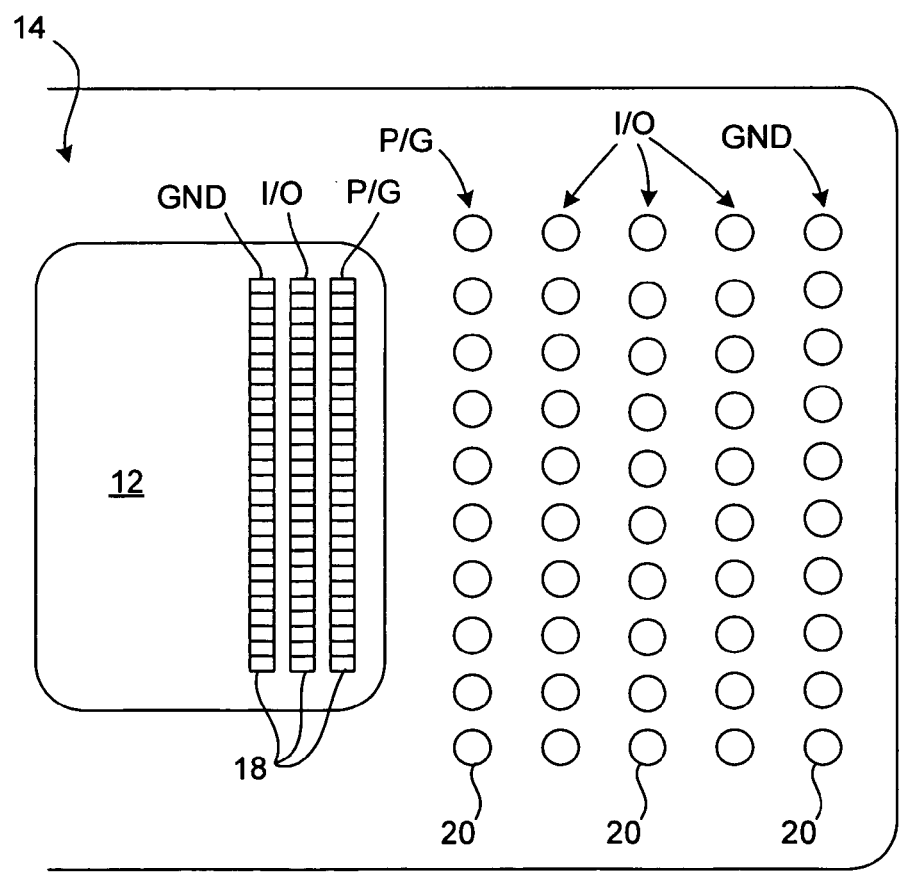
Figure 2C:
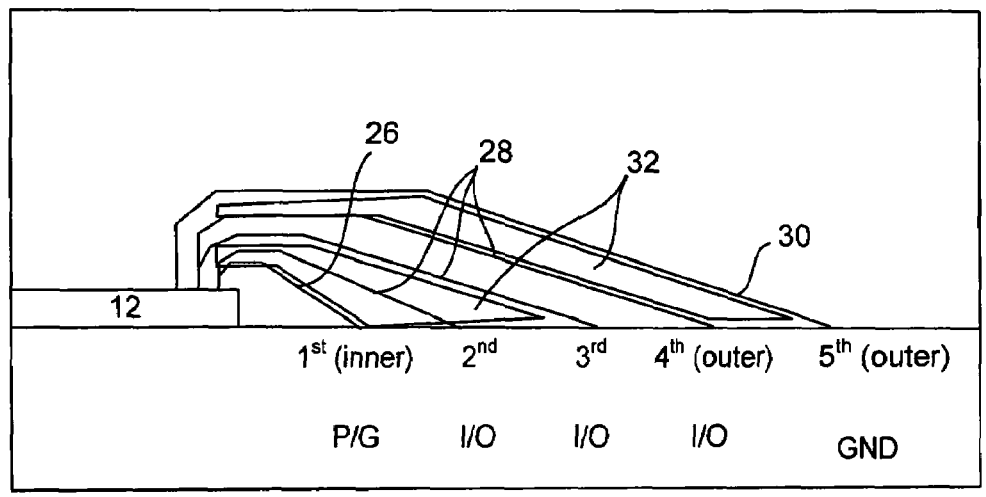

FIGS. 2A-2C are diagrams of a BGA package according to one embodiment of the present invention.

FIGS. 2A and 2B illustrate a cross section and a top-down view of the BGA package 30 according to one embodiment of the present invention. In the Figures, a die 12 is shown mounted onto a substrate 14. The die 12 includes an additional ring (i.e., a total of three rings) of contacts 18, as opposed to two rings as commonly found with prior router BGA packages. The three rings include an inner most ground (GND) ring of contacts 18, a middle ring of input/output (I/O) contacts 18, and an outer ring of power/ground (P/G) contacts 18. The substrate 14 has a first, inner most ring of power/ground (P/G) contacts 20, second, third and fourth rings of input/output (I/O) contacts 20, and a fifth, outer, ring of ground (GND) contacts. It should be noted that the number of input/output rings is not limited to three. Either fewer or more input/output rings could be used in accordance with this embodiment of the present invention.

In one variation of the embodiment shown in FIGS. 2A and 2B, the additional inner ground ring is used in place of the conventional two row stagger of rings or single ring commonly used on previous die. With this arrangement, the size of the die 12 does not have to be increased to use the present invention.

Figure 3:
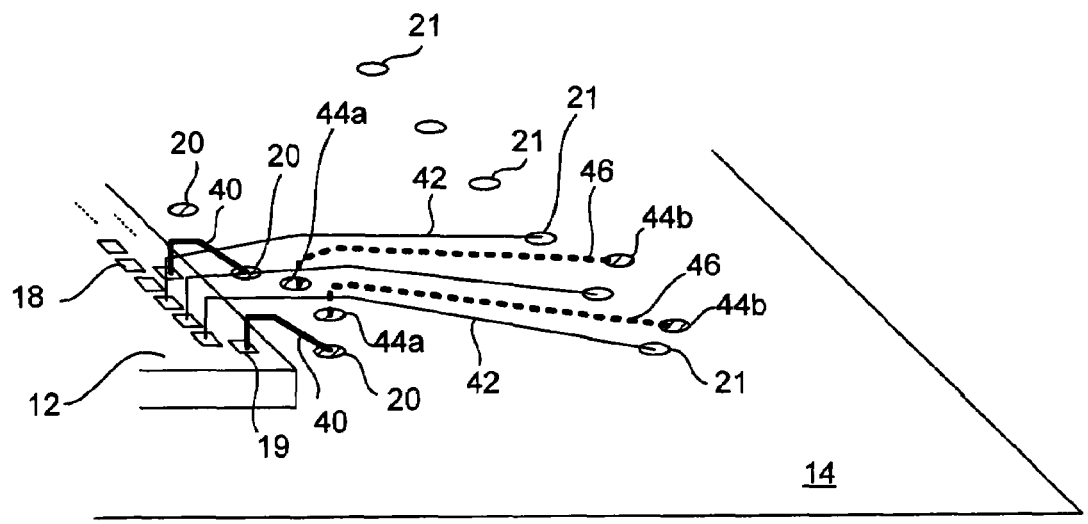
FIG. 3 is a diagram of another BGA package according to another embodiment of the present invention, It should be noted that like reference numbers refer to like elements in the figures.

Referring to FIG. 2C, the wire bonding scheme for the embodiment shown in FIGS. 2A and 2B are shown. Specifically, the outer ring of power/ground (P/G) contacts 18 on the die 12 are bonded with wires 26 to the inner most ring of power/ground (P/G) contacts 20 on the substrate 14. This arrangement provides for lower inductance and resistance for the power/ground signals than otherwise provided with prior art BGA packages. The middle ring of input/output contacts 18 on the die are bonded with wires 28 to the second, third and fourth rings of input/output (I/O) contacts 20 on the substrate. Lastly, the inner ring of ground (GND) contacts 18 on the die are bonded with wires 30 to the outer most ground (GND) ring of contacts 20 on the substrate 14. With this arrangement, the I/O bond wires 28 are sandwiched between the ground wires 26 bonded to the inner P/G ring on the substrate 14 and the ground wires 30 bonded to the outer most ground (GND) ring of contacts 20. This arrangement allows each input/output (I/O) wire 28 to find a nearby ground wire to be used as a return current loop 32. Thus, the length of the return current loop 32 can be significantly reduced FIG. 3 is a diagram of another BGA package according to another embodiment of the present invention. In this embodiment, a die is mounted onto a substrate 14. The die 12 includes an inner ring of input/output (I/O) contacts 18 and an outer ring of power/ground contacts 19 along the periphery of the die. The substrate 14 includes an inner ring of power/ground contacts 20 and an outer ring of input/output contacts 21. As illustrated in the figure, ground bond wires 40 are coupled between select ground contacts 19 on the die 12 and the contacts 20 on the substrate 14 respectively. Input/output bond wires 42 are provided between the I/O contacts 18 on the die 12 and the contacts 21 on the substrate 14. Additional pairs of ground contacts 44a and 44b are provided on the surface of the substrate 14 between and adjacent to the inner ring of contacts 20 and the outer ring of contacts 21 respectively. More specifically, the ground contacts 44b are positioned between each of the input/output contacts 21 on the substrate. Ground wires 46 are bonded between the ground contacts 44a and 44b. As a result, a ground wire 46 is positioned relatively very close to the adjacent input/output bond wires 42.

The use of the ground wires 46 and ground pads 44a and 44b between the input/output bond wires 42 provides a number of advantages. The additional ground wires 46 are provided on the substrate 14. As a result, no modifications to the die 12, such as additional contacts 18 or 19 or a reduced input/output count, is needed. The ground wires 46 also run a significant portion of the length of the adjacent input/output wires 42. Consequently, the return path current loop for the wires 42 is significantly closer and more effective than with the prior art wire bond arrangements. Cross talk and characteristic impedance between the wires 42 is also improved. Lastly, the additional ground wires 46 do not increase the area required for the I/O wire spacing on the substrate 14 since they are positioned between existing ground contacts 20 and 21. Thus, overall size of the package is not increased.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A semiconductor package, comprising:
   a substrate having:
      a die attach area;
      an inner first ring including a plurality of spaced apart power/ground contacts;
      a second outer ring including a plurality of spaced apart input/output contacts; and
      a plurality of matching pairs of ground contacts, each matching pair of ground contacts having a first ground contact provided between two of the spaced apart power/ground contacts of the inner first ring and a second ground contact provided generally between each of the spaced apart and adjacent input/output contacts;

a die mounted onto the die attach area of the substrate, the die having one or more rings of contacts provided around the periphery of the die, each of the contacts being characterized as either input/output contacts, power contacts or ground contacts;

a first plurality of input/output wires bonded between the input/output contacts on the die and the input/output contacts of the second outer ring on the substrate respectively; and a second plurality of ground wires bonded between the first ground contacts and the second ground contacts of the plurality of matching pairs of ground contacts on the substrate, the second plurality of ground wires running adjacent to and for a portion of the length of the first plurality of input/output wires respectively, such that each input/output wire is in close proximity and adjacent to one of the ground wires.

2. The package of claim 1, further comprising a third plurality of ground wires bonded between the ground contacts on the die and the ground contacts of the inner first ring on the substrate.

3. The package of claim 1, further comprising solder balls located on a second side of the substrate, the second side being opposite a surface including the die attach area where the die is attached to the substrate.

4. The package of claim 3, further comprising a plurality of traces on and through the substrate to electrically couple the spaced apart power/ground contacts and the spaced apart input/output contacts with the solder balls respectively.

5. The package of claim 1, further comprising an encapsulant to encapsulate the die, the substrate and the first and the second plurality of wire bonds.

6. The package of claim 1, wherein the second plurality of ground bond wires provides a return ground path loop between the first plurality of bond wires respectively.

7. The package of claim 1, wherein the second plurality of bond wires reduces cross talk between the first plurality of bond wires respectively.

8. A semiconductor package, comprising:
a substrate including:
a die attach area;
a first inner ring including a plurality of power/ground contacts immediately adjacent and surrounding the die attach area;
at least one intermediate ring including a plurality of input/output contacts surrounding the first inner ring; and
an outer ring including a plurality of ground contacts surrounding the at least one intermediate ring;
a die attached to the die attach area of the substrate, the die further including:
an outer ring of power/ground contacts;
an intermediate ring of input/output contacts; and
an inner ring of ground contacts; and
a plurality of power/ground wires bonded between the outer ring of the die and the inner ring of the substrate;
a plurality of input/output wires bonded between the intermediate ring of the die and the at least one intermediate ring of the substrate; and
a plurality of ground wires bonded between the inner ring of the die and the outer ring of the substrate;
wherein each input/output wire is in close proximity and adjacent to one of the plurality of ground wires or one of the plurality of power/ground wires.

9. The package of claim 8, further comprising a second intermediate ring including a plurality of input/output contacts surrounding the first intermediate ring.

10. The package of claim 9, further comprising a third intermediate ring including a plurality of input/output contacts surrounding the second intermediate ring.

11. The package of claim 9, further comprising an encapsulant to encapsulate the die, substrate and the plurality of bond wires.

12. The package of claim 8, further comprising a plurality of solder balls located on a surface of the substrate opposite the surface of the die attach area.

13. The package of claim 12, further comprising a plurality of traces on and through the substrate to electrically couple the plurality of solder balls with the power/ground contacts, input/output contacts, and the ground contacts of the first inner ring, at least one intermediate ring, and the outer ring respectively.

14. A method, comprising:
providing a substrate having:
a die attach area;
an inner first ring including a plurality of spaced apart power/ground contacts;
a second outer ring including a plurality of spaced apart input/output contacts; and
a plurality of matching pairs of ground contacts, each matching pair of ground contacts having a first ground contact provided generally between two of the spaced apart power/ground contacts of the inner first ring and a second ground contact provided generally between each of the spaced apart and adjacent input/output contacts;
providing a die mounted onto the die attach area of the substrate, the die having one or rings of contacts provided generally around the periphery of the die, each of the contacts being characterized as either input/output contacts, power contacts, or ground contacts;
providing a first plurality of input/output wires bonded between the input/output contacts on the die and the input/output contacts of the second outer ring on the substrate respectively; and
providing a second plurality of ground wires bonded between the first ground contacts and the second ground contacts of the plurality of matching pairs of ground contacts on the substrate, the second plurality of ground wires running adjacent to and for a significant portion of the length of the first plurality of input/output wires respectively, wherein each input/output wire is in close proximity and adjacent to one of the ground wires.

15. The method of claim 14, further comprising:
providing solder balls located on a second side of the substrate, the second side being opposite a surface including the die attach area where the die is attached to the substrate;
providing a plurality of traces on and through the substrate to electrically couple the spaced apart power/ground contacts and the spaced apart input/output contacts with the solder balls respectively; and
providing an encapsulant to encapsulate the die, the substrate and the first and the second plurality of wire bonds.

16. A method, comprising:
providing a substrate including:
a die attach area;
a first inner ring including a plurality of power/ground contacts immediately adjacent and surrounding the die attach area;
at least one intermediate ring including a plurality of input/output contacts surrounding the first inner ring; and an outer ring including a plurality of ground contacts surrounding the at least one intermediate ring;

providing a die attached to the die attach area of the substrate, the die further including:
an outer ring of power/ground contacts;
an intermediate ring of input/output contacts; and
an inner ring of ground contacts; and providing a plurality of power and ground wires bonded between the outer ring of the die and the inner ring of the substrate;

a plurality of input/output wires bonded between the intermediate ring of the die and the at least one intermediate ring of the substrate; and a plurality of ground wires bonded between the inner ring of the die and the outer ring of the substrate;

wherein each input/output wire is in close proximity and adjacent to one of the plurality of ground wires.

17. The method of claim 16, further comprising providing a second intermediate ring including a plurality of input/output contacts surrounding the first intermediate ring.

18. The method of claim 17, further comprising providing a third intermediate ring including a plurality of input/output contacts surrounding the second intermediate ring.

19. The method of claim 16, further comprising providing a plurality of solder balls located on a surface of the substrate opposite the die attach area and providing a plurality of traces on and through the substrate to electrically couple the plurality of solder balls with the power/ground contacts, input/output contacts, and the ground contacts of the first inner ring, at least one intermediate ring, and the outer ring respectively.

20. The method of claim 16, further comprising providing an encapsulant to encapsulate the die, substrate and the plurality of bond wires.

21. A semiconductor package, comprising:
a substrate having:
a die attach area;
an inner first ring including a plurality of spaced apart power/ground contacts;
a second outer ring including a plurality of spaced apart input/output contacts; and
a plurality of matching pairs of ground contacts, each matching pair of ground contacts having a first ground contact provided between every two adjacent spaced apart power/ground contacts of the inner first ring and a second ground contact provided between every two adjacent spaced apart input/output contacts;

a die mounted onto the die attach area of the substrate, the die having one or more rings of contacts provided generally around the periphery of the die, each of the contacts being characterized as either input/output contacts, power contacts or ground contacts;

a first plurality of input/output wires bonded between the input/output contacts on the die and the input/output contacts of the second outer ring on the substrate respectively; and a second plurality of ground wires bonded between the first ground contacts and the second ground contacts of the plurality of matching pairs of ground contacts on the substrate, the second plurality of ground wires running adjacent to and for a portion of the length of the first plurality of input/output wires respectively, such that each input/output wire is in close proximity and adjacent to one of the ground wires.

\* \* \* \* \*